US012738896B2

(12) United States Patent
Kudo et al.

(10) Patent No.: US 12,738,896 B2
(45) Date of Patent: Sep. 15, 2026

(54) HIGH VOLTAGE AMPLIFIER

(71) Applicant: HITACHI HIGH-TECH CORPORATION, Tokyo (JP)

(72) Inventors: Ryohei Kudo, Tokyo (JP); Tomoharu Nagashima, Tokyo (JP); Hisaaki Kanai, Tokyo (JP); Wen Li, Tokyo (JP); Shinichi Murakami, Tokyo (JP); Naoya Ishigaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 444 days.

(21) Appl. No.: 18/288,834

(22) PCT Filed: May 11, 2022

(86) PCT No.: PCT/JP2022/019947

§ 371 (c)(1),
(2) Date: Oct. 30, 2023

(87) PCT Pub. No.: WO2022/264716

PCT Pub. Date: Dec. 22, 2022

(65) Prior Publication Data

US 2024/0223134 A1 Jul. 4, 2024

(30) Foreign Application Priority Data

Jun. 17, 2021 (JP) ................................ 2021-100712

(51) Int. Cl.
*H03F 1/30* (2006.01)
*H03F 3/04* (2006.01)
(Continued)

(52) U.S. Cl.
CPC ............. *H03F 1/301* (2013.01); *H03F 3/213* (2013.01); *H03F 3/3066* (2013.01); *H03F 2200/129* (2013.01)

(58) Field of Classification Search
CPC .... H03F 1/301; H03F 3/213; H03F 2200/129; H03F 3/303; H03F 3/45744;
(Continued)

(56) References Cited

U.S. PATENT DOCUMENTS 4,471,323 A 9/1984 Trilling
4,752,745 A 6/1988 Pass
(Continued)

FOREIGN PATENT DOCUMENTS

JP 58-143611 A 8/1983
JP 59-69522 U 5/1984
(Continued)

OTHER PUBLICATIONS

International Search Report of PCT/JP2022/019947 dated Aug. 9, 2022.

*Primary Examiner* — Khanh V Nguyen
(74) *Attorney, Agent, or Firm* — MATTINGLY & MALUR, PC

(57) ABSTRACT

The high voltage amplifier includes: an input circuit configured to amplify an input signal and connected to a positive-electrode-side level shift circuit and a negative-electrode-side level shift circuit; a high-voltage output circuit including a positive-electrode-side output circuit configured to amplify a signal from the positive-electrode-side level shift circuit and a negative-electrode-side output circuit configured to amplify a signal from the negative-electrode-side level shift circuit; a feedback circuit which feeds back an output signal from the high-voltage output circuit to the input signal; a detection circuit configured to detect currents of the positive-electrode-side and negative-electrode-side output circuits, and an offset adjustment circuit configured to increase an offset amount of the negative-electrode-side level shift circuit to a negative side when a current of the positive-electrode-side output circuit increases, and increase (Continued)

an offset amount of the positive-electrode-side level shift circuit to a positive side when a current of the negative-electrode-side output circuit increases.

9 Claims, 5 Drawing Sheets

(51) Int. Cl.
*H03F 3/213* (2006.01)
*H03F 3/30* (2006.01)

(58) Field of Classification Search
CPC ........... H03F 3/45968; H03F 2200/447; H03F 2200/462; H03F 3/45475
USPC .......................................... 330/262–266, 289
See application file for complete search history.

(56) References Cited

U.S. PATENT DOCUMENTS 4,833,423 A * 5/1989 Molloy .................. H03F 1/307 330/265
7,471,151 B2 * 12/2008 Kan ......................... H03F 3/26 330/264
10,862,437 B2 * 12/2020 Yoshida ............... H03F 3/3069
2002/0171478 A1 * 11/2002 Wouters ............. H03F 3/45475 330/69

FOREIGN PATENT DOCUMENTS

JP 09-321546 A 12/1997
JP 2001-53558 A 2/2001
JP 2002-368552 A 12/2002

* cited by examiner

[FIG. 1]
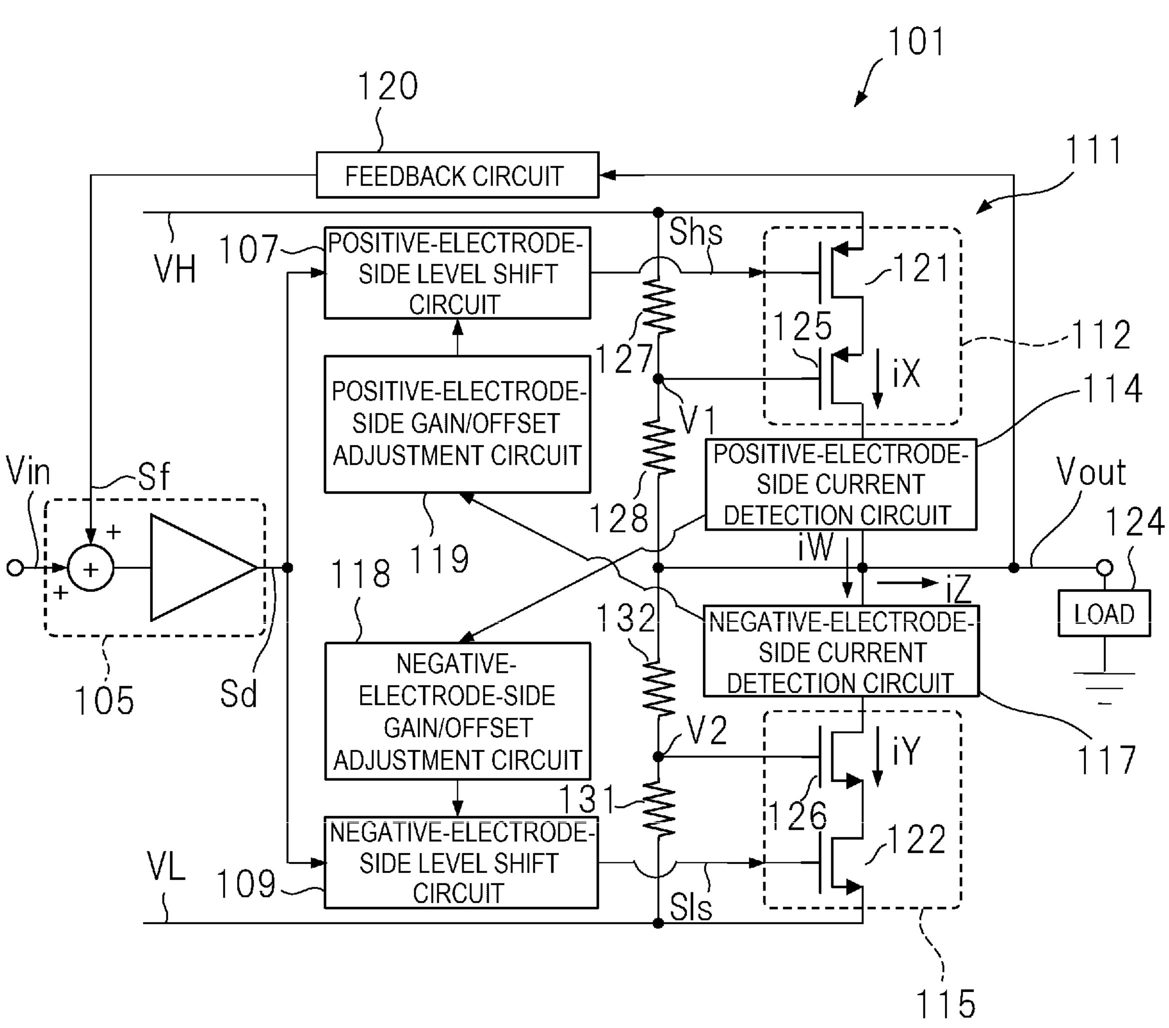

[FIG. 2]
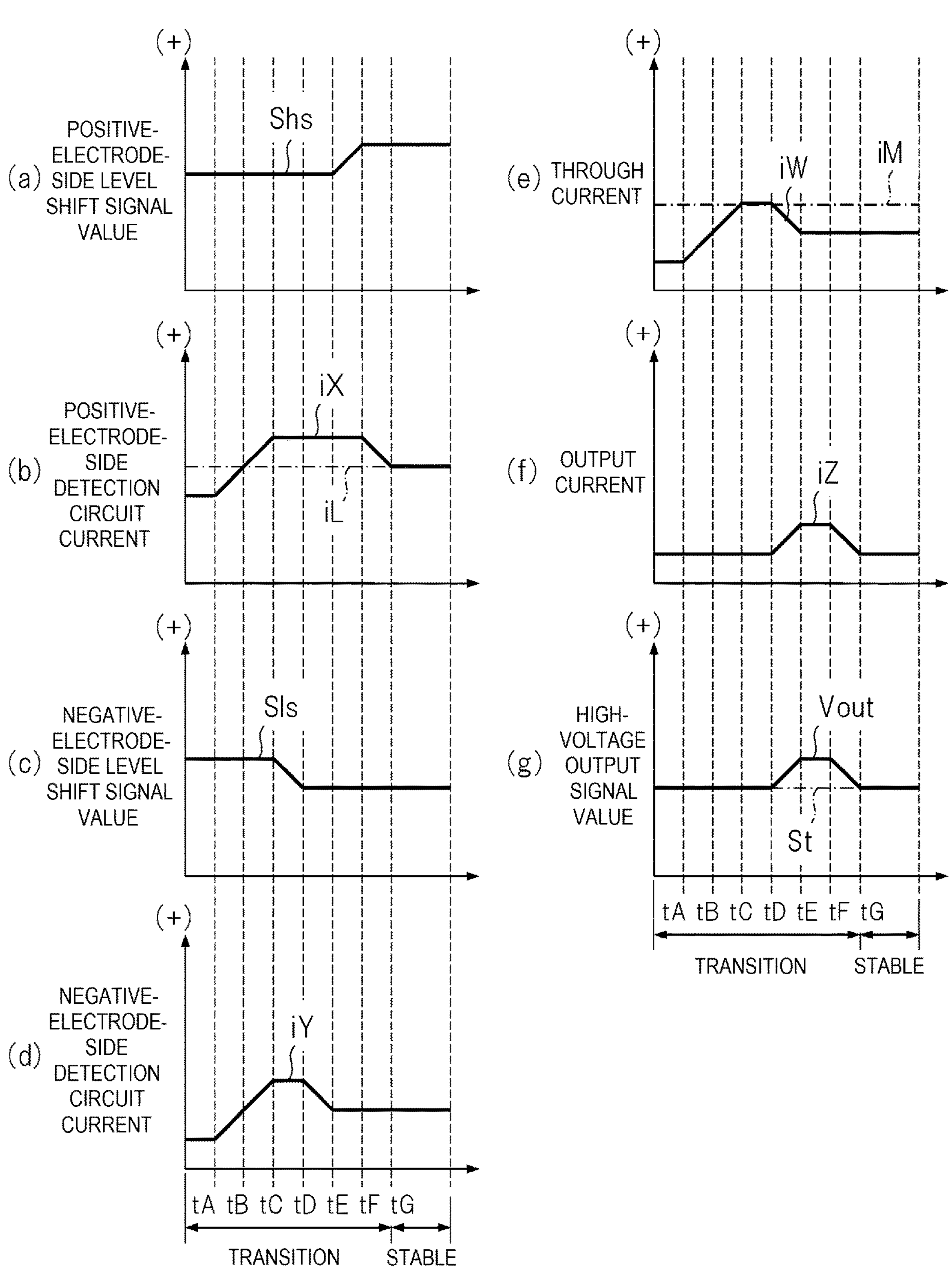

[FIG. 3]
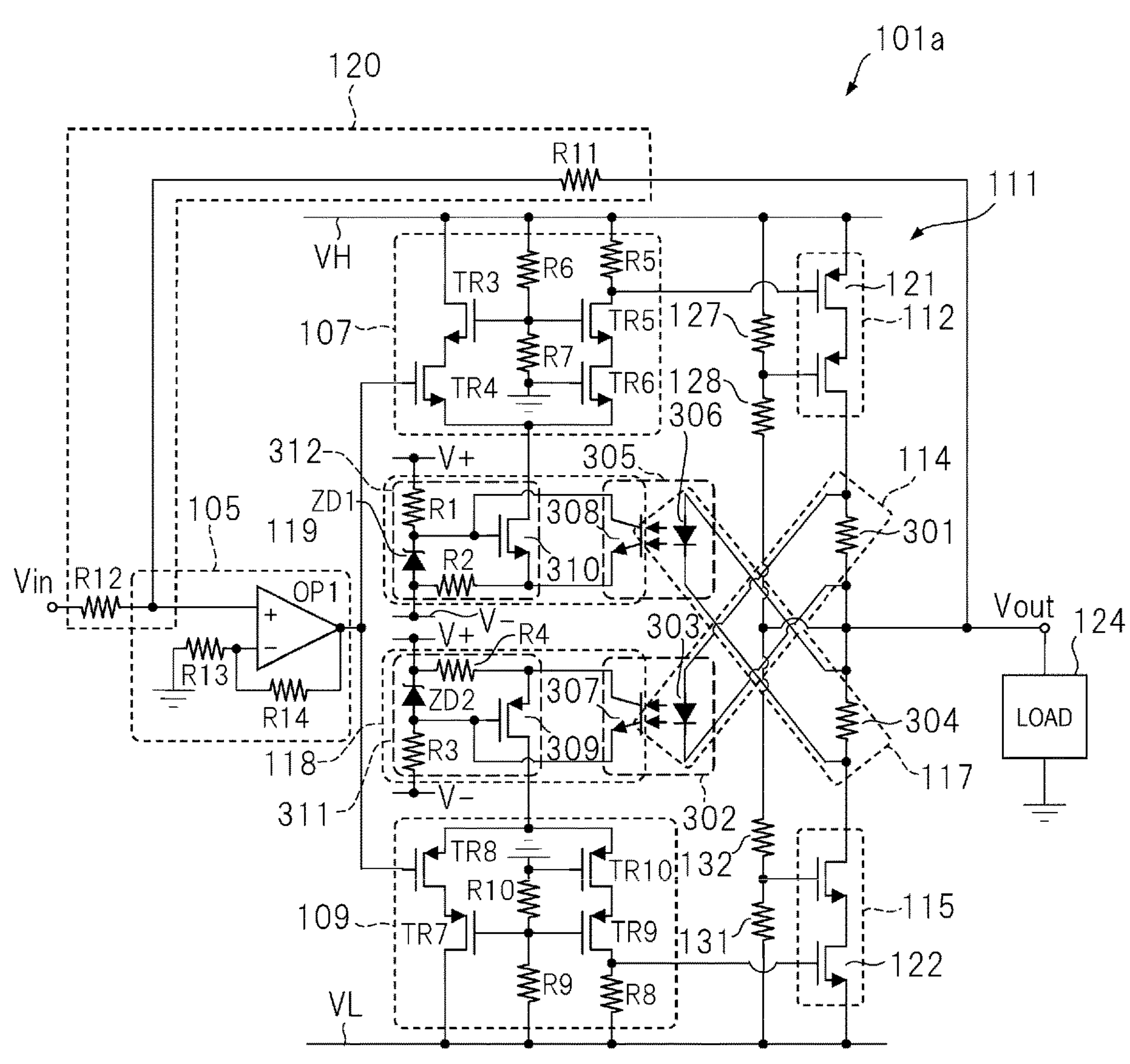

[FIG. 4]
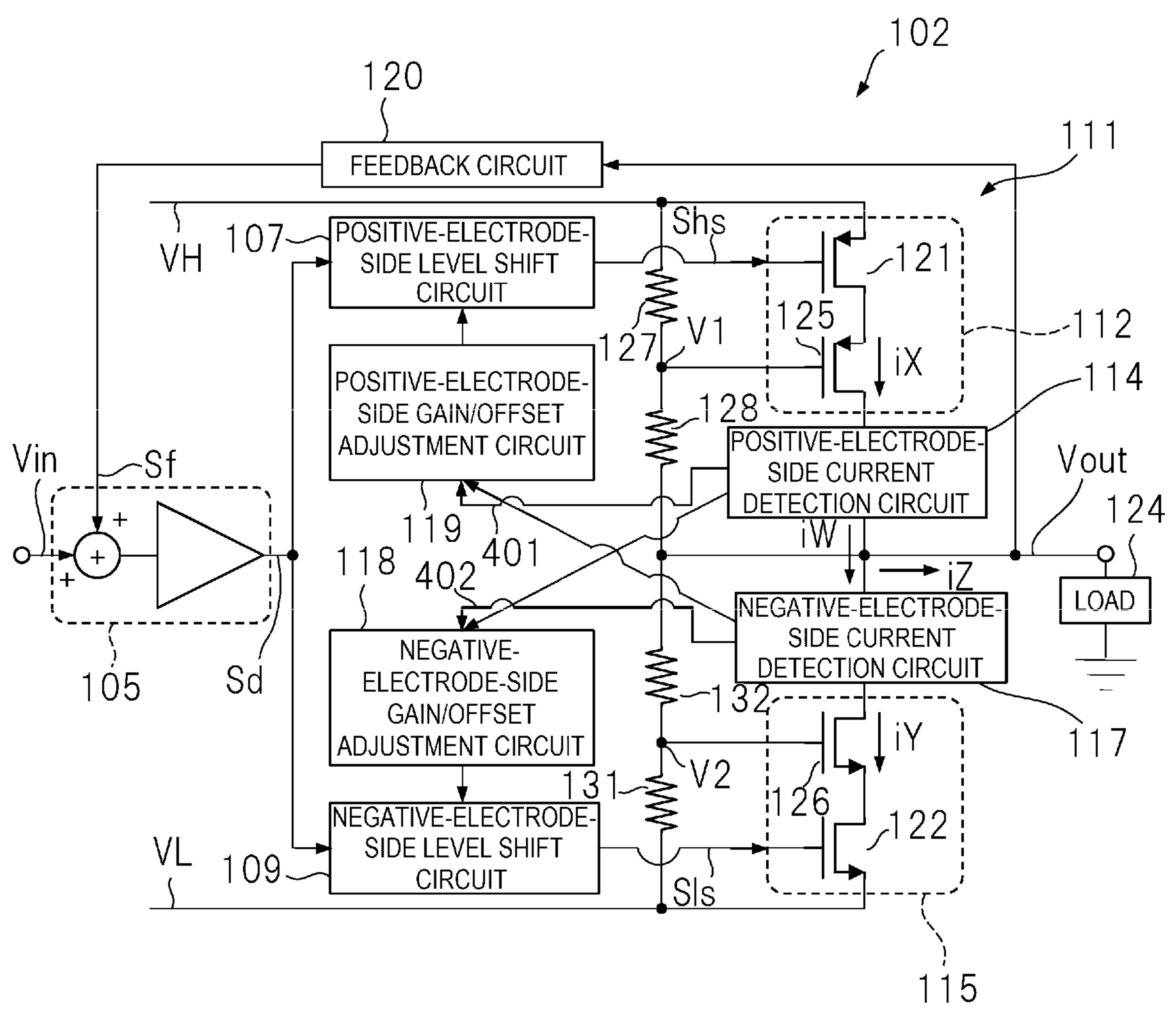

[FIG. 5]
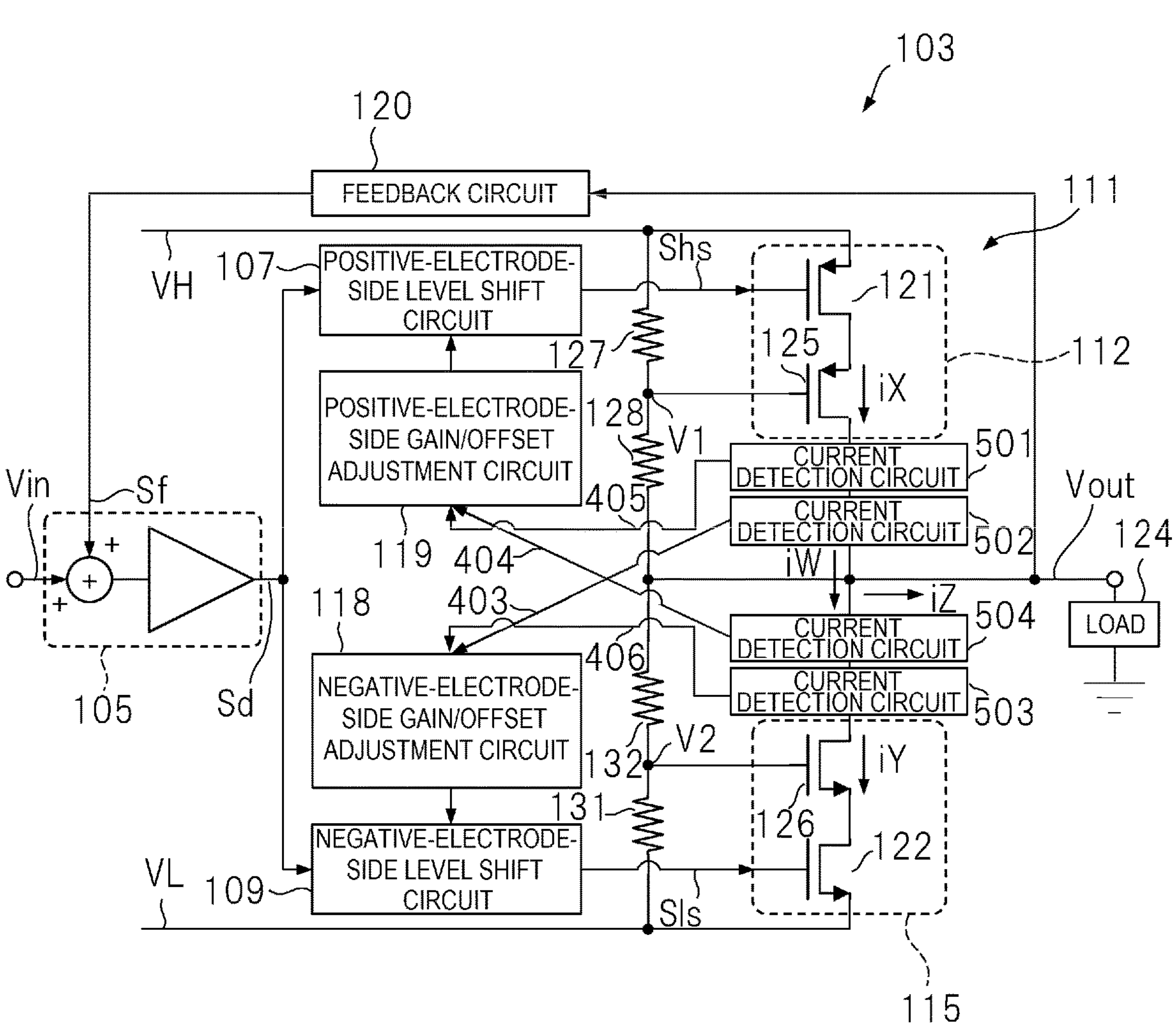

HIGH VOLTAGE AMPLIFIER

TECHNICAL FIELD

The present invention relates to a high voltage amplifier that amplifies a low-voltage signal to a high-voltage signal.

BACKGROUND ART

A circuit configuration that amplifies a low-voltage signal to a high-voltage signal is disclosed in PTL 1. The PTL 1 discloses an amplifier circuit that can be used as an operational amplifier even if a voltage difference between a high-potential power supply and a low-potential power supply is equal to or larger than a breakdown voltage of a single MOSFET (metal-oxide-semiconductor field-effect transistor).

CITATION LIST

Patent Literature

PTL 1: JP2001-53558A

SUMMARY OF INVENTION

Technical Problem

In the technique disclosed in PTL 1, no consideration is given to controlling a through current that flows from the high-potential power supply through a high-voltage output circuit to the low-potential power supply.

In reality, there is non-ideality of an element used in an amplifier, for example, a variation in characteristics based on accuracy of manufacturing of a MOSFET used in an output circuit, deterioration over time, a change in characteristics due to a fluctuation in an environmental temperature and the like.

Such non-ideality of the element causes a fluctuation in a magnitude of a through current in a positive-electrode-side output circuit and a negative-electrode-side output circuit of a high voltage amplifier. When the through current fluctuates, the fluctuation influences a heat generation amount, linearity, an amount of a current that can be supplied, and the like of a high-voltage amplifier circuit.

Therefore, in order to maintain the through current according to a design specification, it is necessary to adjust a constant or select an element in a manufacturing stage, or adjust a constant or replace an element during use for each high voltage amplifier.

However, such individual adjustment for each high voltage amplifier is very complicated and requires a lot of man-hours, resulting in an increase in a manufacturing cost and a maintenance cost. Further, compensation for a fluctuation in an environmental temperature and the like is not easy.

Under such circumstances, it is desired to provide a high voltage amplifier that can stably maintain a through current without individual adjustment.

Solution to Problem

A representative overview of an invention among inventions disclosed in the present application will be simply described below.

A high voltage amplifier according to a representative embodiment of the invention including: an input circuit configured to amplify an input signal; a positive-electrode-side level shift circuit configured to shift an input amplified signal from the input circuit to a positive side; a negative-electrode-side level shift circuit configured to shift the input amplified signal to a negative side; a high-voltage output circuit including a positive-electrode-side output circuit configured to amplify a positive-electrode-side level shift signal from the positive-electrode-side level shift circuit and a negative-electrode-side output circuit configured to amplify a negative-electrode-side level shift signal from the negative-electrode-side level shift circuit; and a feedback circuit configured to feed back a high-voltage output signal from the high-voltage output circuit to the input signal, in which the high voltage amplifier includes a positive-electrode-side current detection circuit configured to detect a current that flows to the positive-electrode-side output circuit, a negative-electrode-side current detection circuit configured to detect a current that flows to the negative-electrode-side output circuit, a positive-electrode-side offset adjustment circuit configured to perform adjustment to increase an offset amount of the positive-electrode-side level shift circuit to a positive side when a negative-electrode-side detected current of the negative-electrode-side current detection circuit increases, and a negative-electrode-side offset adjustment circuit configured to perform adjustment to increase an offset amount of the negative-electrode-side level shift circuit to a negative side when a positive-electrode-side detected current of the positive-electrode-side current detection circuit increases.

Advantageous Effects of Invention

Advantageous effects obtained by representative inventions among inventions disclosed in the present application will be simply described below.

According to a representative embodiment of the invention, it is possible to provide a high voltage amplifier that can stably maintain a through current without individual adjustment.

BRIEF DESCRIPTION OF DRAWINGS

FIG. 1 is a block diagram showing an example of a configuration of a high voltage amplifier according to Embodiment 1.

FIG. 2 is a graph showing an example of time changes in various signal values and currents during an operation of the high voltage amplifier according to Embodiment 1.

FIG. 3 is a diagram showing a mounting example of the high voltage amplifier according to Embodiment 1.

FIG. 4 is a block diagram showing an example of a configuration of a high voltage amplifier according to Embodiment 2.

FIG. 5 is a block diagram showing an example of a configuration of a high voltage amplifier according to Embodiment 3.

DESCRIPTION OF EMBODIMENTS

Hereinafter, embodiments of the invention will be described. Each embodiment described below is an example of implementing the invention, and does not limit a technical scope of the invention. Problems, configurations, and effects other than those described above become apparent by description of the following embodiments.

In the following embodiments, components having the same function are denoted by the same reference numerals, and repeated description thereof will be omitted unless particularly necessary.

Embodiment 1

A high voltage amplifier according to Embodiment 1 will be described.

<Overview of High Voltage Amplifier According to Embodiment 1>

The high voltage amplifier according to Embodiment 1 detects a current that flows through a positive electrode side and a current that flows through a negative electrode side of a high-voltage output circuit, feeds back signals to level shift stages of a positive electrode and a negative electrode based on detected current values, and adjusts a level shift stage output voltage, thereby automatically controlling an output stage through current to an appropriate value. As a result, both low heat generation and high linearity are automatically achieved even if variations in characteristics of circuit elements or characteristic fluctuations due to a temperature fluctuation, a time change, and the like occur. In the present embodiment, several volts to several tens of volts are assumed as an input signal value, that is, an input voltage, and about several hundreds of volts are assumed as an output signal value, that is, an output voltage, but the invention is not limited thereto.

<Example of Configuration and Connection Form of High Voltage Amplifier>

FIG. 1 is a block diagram showing an example of a configuration of the high voltage amplifier according to Embodiment 1. A high voltage amplifier 101 according to Embodiment 1 is a voltage feedback type inverting amplifier circuit.

As shown in FIG. 1, the high voltage amplifier 101 includes an error amplifier circuit 105 (input circuit), a positive-electrode-side level shift circuit 107, a negative-electrode-side level shift circuit 109, a high-voltage output circuit 111, a negative-electrode-side gain/offset adjustment circuit 118, a positive-electrode-side gain/offset adjustment circuit 119, a feedback circuit 120, and voltage dividing resistors 127, 128, 131, and 132. Further, the high-voltage output circuit 111 includes a positive-electrode-side output circuit 112, a positive-electrode-side current detection circuit 114, a negative-electrode-side output circuit 115, and a negative-electrode-side current detection circuit 117.

An output terminal of the error amplifier circuit 105 is connected to the positive-electrode-side level shift circuit 107 and the negative-electrode-side level shift circuit 109. An output terminal of the positive-electrode-side level shift circuit 107 is connected to the positive-electrode-side output circuit 112. An output terminal of the negative-electrode-side level shift circuit 109 is connected to the negative-electrode-side output circuit 115. The voltage dividing resistors 127, 128, 132, and 131 are connected in series between a line that supplies a positive electrode voltage VH and a line that supplies a negative electrode voltage VL. A connection midpoint between the voltage dividing resistors 127 and 128 is connected to the positive-electrode-side output circuit 112. A connection midpoint between the voltage dividing resistors 131 and 132 is connected to the negative-electrode-side output circuit 115. The positive-electrode-side output circuit 112, the positive-electrode-side current detection circuit 114, the negative-electrode-side current detection circuit 117, and the negative-electrode-side output circuit 115 are connected in series. A connection midpoint between the voltage dividing resistors 128 and 132 is connected to a connection midpoint between the positive-electrode-side current detection circuit 114 and the negative-electrode-side current detection circuit 117. The connection midpoint between the positive-electrode-side current detection circuit 114 and the negative-electrode-side current detection circuit 117 is an output terminal of the high voltage amplifier 101. A load 124 is connected to the output terminal.

The positive-electrode-side current detection circuit 114 may be disposed upstream or downstream of a current path of the positive-electrode-side output circuit 112. Similarly, the negative-electrode-side current detection circuit 117 may be disposed upstream or downstream of a current path of the negative-electrode-side output circuit 115.

The positive-electrode-side current detection circuit 114 is connected to the negative-electrode-side gain/offset adjustment circuit (negative-electrode-side offset adjustment circuit) 118. The negative-electrode-side gain/offset adjustment circuit 118 is connected to the negative-electrode-side level shift circuit 109. The negative-electrode-side current detection circuit 117 is connected to the positive-electrode-side gain/offset adjustment circuit (positive-electrode-side offset adjustment circuit) 119. The positive-electrode-side gain/offset adjustment circuit 119 is connected to the positive-electrode-side level shift circuit 107.

The error amplifier circuit 105 amplifies an error between a target voltage setting signal (input signal) Vin and a feedback signal Sf, and outputs an error amplified signal (input amplified signal) Sd.

The positive-electrode-side level shift circuit 107 shifts the input error amplified signal Sd to a positive side, and outputs a positive-electrode-side level shift signal Shs. The negative-electrode-side level shift circuit 109 shifts the input error amplified signal Sd to a negative side, and outputs a negative-electrode-side level shift signal Sls.

The high-voltage output circuit 111 includes the positive-electrode-side output circuit 112 and the negative-electrode-side output circuit 115. The positive-electrode-side output circuit 112 amplifies the input positive-electrode-side level shift signal Shs. The negative-electrode-side output circuit 115 amplifies the input negative-electrode-side level shift signal Sls. The high-voltage output circuit 111 amplifies the level shift signals, thereby outputting a high-voltage output signal Vout.

The positive-electrode-side current detection circuit 114 detects a positive-electrode-side output circuit current iX that flows through the positive-electrode-side output circuit 112 of the high-voltage output circuit 111. The negative-electrode-side current detection circuit 117 detects a negative-electrode-side output circuit current iY that flows through the negative-electrode-side output circuit 115 of the high-voltage output circuit 111.

In the present embodiment, when the positive-electrode-side output circuit current (positive-electrode-side detected current) iX exceeds a preset positive-electrode-side limit value, the positive-electrode-side current detection circuit 114 is configured to output a positive-electrode-side current detection signal. Further, when the negative-electrode-side output circuit current (negative-electrode-side detected current) iY exceeds a preset negative-electrode-side limit value, the negative-electrode-side current detection circuit 117 is configured to output a negative-electrode-side current detection signal.

The negative-electrode-side gain/offset adjustment circuit 118 adjusts a gain and an offset amount of the negative-electrode-side level shift circuit 109 based on the positive-electrode-side current detection signal output from the positive-electrode-side current detection circuit 114. The positive-electrode-side gain/offset adjustment circuit 119 adjusts a gain and offset amount of the positive-electrode-side level shift circuit 107 based on the negative-electrode-side current detection signal output from the negative-electrode-side current detection circuit 117.

For example, the negative-electrode-side gain/offset adjustment circuit 118 adjusts the offset amount of the negative-electrode-side level shift circuit 109 to increase the offset amount to the negative side when the positive-electrode-side output circuit current iX detected by the positive-electrode-side current detection circuit 114 increases. Further, the positive-electrode-side gain/offset adjustment circuit 119 adjusts the offset amount of the positive-electrode-side level shift circuit 107 to increase the offset amount to the positive side when the negative-electrode-side output circuit current iY detected by the negative-electrode-side current detection circuit 117 increases.

In the present embodiment, in response to the positive-electrode-side current detection signal output from the positive-electrode-side current detection circuit 114, the negative-electrode-side gain/offset adjustment circuit 118 adjusts the offset amount of the negative-electrode-side level shift circuit 109 to increase the offset amount to the negative side. Further, in response to the negative-electrode-side current detection signal output from the negative-electrode-side current detection circuit 117, the positive-electrode-side gain/offset adjustment circuit 119 adjusts the offset amount of the positive-electrode-side level shift circuit 107 to increase the offset amount to the positive side. In this case, there is an advantage that it is easy to set the current limit as designed.

The feedback circuit 120 generates the feedback signal Sf such that a value of the high-voltage output signal Vout has a predetermined amplification factor with respect to a value of the target voltage setting signal Vin.

Here, the circuits that constitute the high voltage amplifier 101 will be described in more detail. The high voltage amplifier 101 is mainly divided into an input stage, the level shift stage, and an output stage.

The input stage has a configuration including the error amplifier circuit 105. The error amplifier circuit 105 operates to amplify a difference between a value of the target voltage setting signal Vin and a value of the feedback signal Sf. The operation reduces a convergence error between a value of the high-voltage output signal Vout and a target voltage value.

The level shift stage is implemented using the positive-electrode-side level shift circuit 107 and the negative-electrode-side level shift circuit 109. The positive-electrode-side level shift circuit 107 and the negative-electrode-side level shift circuit 109 add bias signals suitable for operations of output circuit input transistors 121 and 122 to the error amplified signal Sd, and output the bias signals as the positive-electrode-side level shift signal Shs and the negative-electrode-side level shift signal Sls.

For example, in the output circuit input transistor 121, a voltage range suitable for the operation is a voltage lower than the positive electrode voltage VH by a gate-source threshold Vth. Therefore, the positive-electrode-side level shift circuit 107 is adjusted such that a value of the positive-electrode-side level shift signal Shs when an input is 0 V (Vin=0) is (VH−Vth). Similarly, in the output circuit input transistor 122, a voltage range suitable for the operation is a voltage higher than the negative electrode voltage VL by a gate-drain threshold Vth. Therefore, the negative-electrode-side level shift circuit 109 is adjusted such that a value of the negative-electrode-side level shift signal Sls when an input is 0 V is (VL+Vth).

The output stage is implemented using the voltage dividing resistors 127, 128, 131, and 132 and the high-voltage output circuit 111. In the present embodiment, the voltage dividing resistors 127, 128, 131, and 132 have the same resistance value. A relationship between the voltage dividing resistors and the high-voltage output circuit 111 will be described in detail in description of “principle of increasing a breakdown voltage by transistor multi-stage configuration of an output stage” to be described later.

In the positive-electrode-side output circuit 112 and the negative-electrode-side output circuit 115 provided in the high-voltage output circuit 111, a push-pull operation is implemented by mutually increasing or decreasing equivalent resistance values thereof.

For example, when a positive voltage is output, the equivalent resistance value of the positive-electrode-side output circuit 112 decreases, and the equivalent resistance value of the negative-electrode-side output circuit 115 increases. Further, when a negative voltage is output, the equivalent resistance value of the positive-electrode-side output circuit 112 increases, and the equivalent resistance value of the negative-electrode-side output circuit 115 decreases. Further, when a voltage near 0 V is output, the equivalent resistance values of the positive-electrode-side output circuit 112 and the negative-electrode-side output circuit 115 are equal and have medium values.

<Operation of High Voltage Amplifier>

How the high voltage amplifier 101 operates with the configurations will be described.

In a stable state, a state is kept in which a value of the target voltage setting signal Vin and a value of the feedback signal Sf are balanced and a value of the high-voltage output signal Vout is constant.

Here, for example, when the value of the target voltage setting signal Vin is increased to the positive side from the stable state, a value of the error amplified signal Sd is also increased by the error amplifier circuit 105. Therefore, a value of the positive-electrode-side level shift signal Shs and a value of the negative-electrode-side level shift signal Sls are also increased by the positive-electrode-side level shift circuit 107 and the negative-electrode-side level shift circuit 109.

When the value of the positive-electrode-side level shift signal Shs is increased, since a drain-source resistance of the output circuit input transistor 121 is increased, the positive-electrode-side output circuit current iX of the positive-electrode-side output circuit 112 decreases. On the other hand, when the value of the negative-electrode-side level shift signal Sls is increased, since a drain-source resistance of the output circuit input transistor 122 is decreased, the negative-electrode-side output circuit current iY of the negative-electrode-side output circuit 115 increases. An output current iZ that is a difference between the positive-electrode-side output circuit current iX and the negative-electrode-side output circuit current iY is decreased, and a value of the high-voltage output signal Vout determined by the output current iZ, the feedback circuit 120, and the load 124 decreases. As the value of the high-voltage output signal Vout decreases, a value of the feedback signal Sf decreases. When a value of the feedback signal Sf is balanced with a value of the target voltage setting signal Vin again, the operations converge, and the high-voltage output signal Vout is stabilized at a constant value.

For example, when a value of the target voltage setting signal Vin is increased to the negative side from the stable state, an operation opposite to that in a case where the value of the target voltage setting signal Vin is increased to the positive side occurs.

That is, a value of the error amplified signal Sd is decreased by the error amplifier circuit 105. Therefore, a value of the positive-electrode-side level shift signal Shs and a value of the negative-electrode-side level shift signal Sls are also decreased by the positive-electrode-side level shift circuit 107 and the negative-electrode-side level shift circuit 109.

When the value of the negative-electrode-side level shift signal Sls is decreased, since the drain-source resistance of the output circuit input transistor 122 increases, the negative-electrode-side output circuit current iY of the negative-electrode-side output circuit 115 decreases. On the other hand, when the value of the positive-electrode-side level shift signal Shs is decreased, since the drain-source resistance of the output circuit input transistor 121 decreases, the positive-electrode-side output circuit current iX of the positive-electrode-side output circuit 112 increases. The output current iZ that is the difference between the positive-electrode-side output circuit current iX and the negative-electrode-side output circuit current iY is increased, and a value of the high-voltage output signal Vout determined by the output current iZ, the feedback circuit 120, and the load 124 increases. As the value of the high-voltage output signal Vout increases, a value of the feedback signal Sf increases. When a value of the feedback signal Sf is balanced with a value of the target voltage setting signal Vin again, the operations converge, and a value of the high-voltage output signal Vout is stabilized at a constant value.

<Principle of Increasing Breakdown Voltage by Transistor Multi-Stage Configuration of Output Stage>

Next, the principle of increasing the breakdown voltage by the transistor multi-stage configuration of the output stage will be described. In the high-voltage output circuit 111 of the high voltage amplifier 101, a high voltage output is enabled by connecting the transistors in multiple stages. Specifically, as shown in FIG. 1, in the positive-electrode-side output circuit 112, a configuration in which the output circuit input transistor 121 and a voltage dividing transistor 125 are connected in series is adopted. Similarly, in the negative-electrode-side output circuit 115, a configuration in which the output circuit input transistor 122 and a voltage dividing transistor 126 are connected in series is adopted.

For example, when a value of the high-voltage output signal Vout is the negative electrode voltage VL that is a negative minimum voltage and Vout=VL, VH−VL that is a differential voltage between the positive electrode voltage VH and the negative electrode voltage VL is applied to the positive-electrode-side output circuit 112. At this time, since a divided voltage V1 generated by the voltage dividing resistors 127 and 128 is (VH+VL)/2, a source voltage of the voltage dividing transistor 125 is about (VH+VL)/2. That is, drain-source voltages of the output circuit input transistor 121 and the voltage dividing transistor 125 are both about (VH−VL)/2.

Similarly, when a value of the high-voltage output signal Vout is the positive electrode voltage VH that is a positive maximum voltage and Vout=VH, VH−VL that is a differential voltage between the positive electrode voltage VH and the negative electrode voltage VL is applied to the negative-electrode-side output circuit 115. At this time, since a divided voltage V2 generated by the voltage dividing resistors 131 and 132 is (VH+VL)/2, a source voltage of the voltage dividing transistor 126 is about (VH+VL)/2. That is, drain-source voltages of the output circuit input transistor 122 and the voltage dividing transistor 126 are both about (VH−VL)/2.

Therefore, according to the present configuration, the drain-source voltage can be divided according to the number of stages of the transistors. Therefore, even if the voltage between power supplies (VH−VL) exceeds element breakdown voltages of the transistors, the high voltage output is enabled by mounting a plurality of transistors.

<Relationship Between Through Current and Crossover Distortion>

However, in a related-art high voltage amplifier using a level shift circuit and transistors respectively on a positive electrode side and a negative electrode side, a gain/offset adjustment circuit connected to the level shift circuit does not exist. In such a related-art high voltage amplifier, a through current iW that flows to output circuits on the positive electrode side and the negative electrode side is determined depending on a level shift voltage supplied by the positive-electrode-side level shift circuit 107 and the negative-electrode-side level shift circuit 109. When a level shift amount approaches a gate-source voltage threshold of each transistor, the through current iW increases. However, on the other hand, a crossover distortion generated near Vout=0 V is reduced. Conversely, when the level shift amount is set away from the gate-source voltage threshold of each transistor, the through current iW decreases. However, on the other hand, the crossover distortion increases.

That is, the reduction in the through current iW and the reduction in the crossover distortion are in a trade-off relationship. In order to implement the balanced states as designed, for example, it is necessary to adjust a level shift voltage of several hundreds of volts in units of several tens of mV, which requires extremely strict adjustment. Further, it is difficult to deal with a change in characteristics of an element during an operation of the high voltage amplifier, for example, a fluctuation in a threshold voltage of a transistor due to self-heat-generation or the like.

Hereinafter, a fact that these problems are improved by the present embodiment will be described in detail with reference to the drawings.

<Time Changes in Various Signals and Currents During Operation of High Voltage Amplifier>

FIG. 2 is a graph showing an example of time changes in various signal values and currents during an operation of the high voltage amplifier according to Embodiment 1. The various signal values and currents in the graph are all relative values. In FIG. 2, (a) shows a value of the positive-electrode-side level shift signal Shs, (b) shows the positive-electrode-side output circuit current iX, (c) shows a value of the negative-electrode-side level shift signal Sls, (d) shows the negative-electrode-side output circuit current iY, (e) shows the through current iW, (f) shows the output current iZ, and (g) shows a value of the high-voltage output signal Vout.

First, when it is assumed that the high voltage amplifier 101 performs a current supply operation, iX=iW+iZ and iY=iW.

For example, a case where gate-source thresholds of the transistors that constitute the high-voltage output circuit 111 fluctuate due to heat generation of circuit elements is assumed. As shown in (b) and (d) in FIG. 2, it is assumed that the positive-electrode-side output circuit current iX and the negative-electrode-side output circuit current iY start to increase since a time point of time tA. Accordingly, as shown in (e) in FIG. 2, the through current iW starts to increase since the time point of the time tA. Then, as shown in (b) in FIG. 2, the positive-electrode-side output circuit current iX exceeds the preset positive-electrode-side limit value iL since a time point of time tB. When the positive-electrode-side output circuit current iX exceeds the positive-electrode-side limit value iL, the positive-electrode-side current detection circuit 114 operates, and the negative-electrode-side gain/offset adjustment circuit 118 increases the offset amount of the negative-electrode-side level shift circuit 109 to the negative side. The offset amount may be substantially increased (adjusted) to the negative side by decreasing (changing) the gain of the negative-electrode-side level shift circuit 109. In this case, there is an advantage that the positive-electrode-side gain/offset adjustment circuit 119 and the negative-electrode-side gain/offset adjustment circuit 118 are easily designed when the positive-electrode-side gain/offset adjustment circuit 119 and the negative-electrode-side gain/offset adjustment circuit 118 are created with analog circuits.

When the offset amount of the negative-electrode-side level shift circuit 109 is increased to the negative side, a value of the negative-electrode-side level shift signal Sls starts to decrease since a time point of time tC as shown in (c) in FIG. 2. When the value of the negative-electrode-side level shift signal Sls decreases, a gate-source voltage of the output circuit input transistor 122 decreases, and the equivalent resistance value of the negative-electrode-side output circuit 115 increases. When the equivalent resistance value of the negative-electrode-side output circuit 115 increases, the negative-electrode-side output circuit current iY decreases, and a part of the through current iW that flows to the negative-electrode-side output circuit 115 is supplied to the feedback circuit 120 and the load 124 as the output current iZ. Therefore, as shown in (f) in FIG. 2, the output current iZ increases since a time point of time tD. Further, as shown in (g) in FIG. 2, a voltage value of the high-voltage output signal Vout also increases since the time point of the time tD.

When a voltage of the high-voltage output signal Vout increases, since a voltage of the feedback signal Sf also increases, an error between a value of the target voltage setting signal Vin and a value of the feedback signal Sf increases. When a value of the error amplified signal Sd generated by the error amplifier circuit 105 is input to the positive-electrode-side level shift circuit 107, a value of the positive-electrode-side level shift signal Shs increases since a time point of time tE as shown in (a) in FIG. 2. At this time, the error amplified signal Sd is also input to the negative-electrode-side level shift circuit 109. On the other hand, since the offset amount of the negative-electrode-side level shift circuit 109 is increased to the negative side by the negative-electrode-side gain/offset adjustment circuit 118, an increase in a voltage of the negative-electrode-side level shift signal Sls is negligibly small. When a value of the positive-electrode-side level shift signal Shs is increased, a gate-source voltage of the output circuit input transistor 121 decreases, and the equivalent resistance value of the positive-electrode-side output circuit 112 increases. When the equivalent resistance value of the positive-electrode-side output circuit 112 increases, the positive-electrode-side output circuit current iX starts to decrease since a time point of time tF as shown in (b) in FIG. 2. As shown in (f) in FIG. 2, the output current iZ decreases since the time tF by an amount that the positive-electrode-side output circuit current iX decreases. Then, as shown in (g) in FIG. 2, the voltage of the high-voltage output signal Vout also starts to decrease since the time tF, and returns to a target value St at a time point of time tG.

The through current iW is often reduced to the limit value iM or less by the series of operations. As a result, in order to improve the linearity around 0 V, even if initial values of gains and offset amounts of the positive-electrode-side level shift circuit 107 and the negative-electrode-side level shift circuit 109 are set such that the positive-electrode-side output circuit current iX and the negative-electrode-side output circuit current iY increase, the operation can be performed while setting the through current iW to an appropriate value.

In the present embodiment, each current detection circuit is configured to output a signal when a detected current exceeds a predetermined limit value, and each gain/offset adjustment circuit is configured to increase the offset amount in response to the signal, but other configurations may be used. For example, each current detection circuit may be configured to output a signal value corresponding to a detected current, and each gain/offset adjustment circuit may be configured to increase an offset amount when the signal value exceeds a predetermined threshold. In this case, there is an advantage that the positive-electrode-side gain/offset adjustment circuit 119 and the negative-electrode-side gain/offset adjustment circuit 118 are easily designed when the positive-electrode-side gain/offset adjustment circuit 119 and the negative-electrode-side gain/offset adjustment circuit 118 are created with programmable semiconductor chips or the like.

<Mounting Example of High Voltage Amplifier>

FIG. 3 is a diagram showing a mounting example of a high voltage amplifier according to Embodiment 1. A high voltage amplifier 101*a* of the mounting example shown in FIG. 3 is an example in which the configuration shown in FIG. 1 is mounted using photo couplers 302 and 305 and a variable current source controlled by the photo couplers 302 and 305.

As shown in FIG. 3, the positive-electrode-side current detection circuit 114 is implemented using a resistor 301 and a photo coupler input end 303 of the photo coupler 302. The negative-electrode-side current detection circuit 117 is implemented using a resistor 304 and a photo coupler input end 306 of the photo coupler 305.

The resistor 301 and the resistor 304 are connected in series between an output side of the positive-electrode-side output circuit 112 and an output side of the negative-electrode-side output circuit 115. The voltage dividing resistors 127, 128, 132, and 131 are connected in series between a power supply line of the positive electrode voltage VH and a power supply line of the negative electrode voltage VL. A connection midpoint between the voltage dividing resistor 128 and the voltage dividing resistor 132 is connected to a connection point between the resistor 301 and the resistor 304. The connection point serves as an output terminal of the high voltage amplifier 101*a*. The load 124 is connected to the output terminal.

The photo coupler input end 303 of the photo coupler 302 is connected in parallel to the resistor 301. The photo coupler input end 306 of the photo coupler 305 is connected in parallel to the resistor 304.

The positive-electrode-side gain/offset adjustment circuit 119 is implemented using a constant current supply unit 312 of the positive-electrode-side level shift circuit 107 and a photo coupler output end 308 of the photo coupler 305. The negative-electrode-side gain/offset adjustment circuit 118 is implemented using a constant current supply unit 311 of the negative-electrode-side level shift circuit 109 and a photo coupler output end 307 of the photo coupler 302.

The constant current supply unit 312 on the positive electrode side is implemented by resistors R1 and R2, a Zener diode ZD1, and a transistor 310 that is a p-type channel MOSFET. The resistor R1 and the Zener diode ZD1 are connected in series between the positive power supply line V+ and the negative power supply line V−. A connection point between the resistor R1 and the Zener diode ZD1 is connected to a gate of the transistor 310. A source of the transistor 310 is connected to the positive power supply line V+ via the resistor R2. A drain of the transistor 310 is connected to the positive-electrode-side level shift circuit 107.

The constant current supply unit 311 on the negative electrode side is implemented by resistors R3 and R4, a Zener diode ZD2, and a transistor 309 that is an n-type channel MOSFET. The Zener diode ZD2 and the resistor R3 are connected in series between the positive power supply line V+ and the negative power supply line V−. A connection point between the Zener diode ZD2 and the resistor R3 is connected to a gate of the transistor 309. A source of the transistor 309 is connected to the negative power supply line V− via the resistor R4. A drain of the transistor 309 is connected to the negative-electrode-side level shift circuit 109.

The positive-electrode-side level shift circuit 107 is implemented by resistors R5 to R7, and transistors TR3 to TR6 that are the p-type channel MOSFETs. The negative-electrode-side level shift circuit 109 is implemented by resistors R8 to R10, and transistors TR7 to TR10 that are the n-type channel MOSFETs.

The transistors TR3 and TR4 connected in series, and the resistor R5 and the transistors TR5 and TR6 connected in series are connected in parallel between the power supply line of the positive electrode voltage VH and the drain of the transistor 310. The resistor R6 and the resistor R7 connected in series are connected between the power supply line of the positive electrode voltage VH and ground. Gates of the transistors TR3 and TR5 are connected to a connection point between the resistor R6 and the resistor R7. A gate of the transistor TR4 is connected to the output terminal of the error amplifier circuit 105. A gate of the transistor TR6 is connected to the ground.

The transistors TR7 and TR8 connected in series, and the resistor R8 and the transistors TR9 and TR10 connected in series are connected in parallel between the power supply line of the negative electrode voltage VL and the drain of the transistor 309. The resistor R9 and the resistor R10 connected in series are connected between the power supply line of the negative electrode voltage VL and the ground. Gates of the transistors TR7 and TR9 are connected to a connection point between the resistor R9 and the resistor R10. A gate of the transistor TR8 is connected to the output terminal of the error amplifier circuit 105. A gate of the transistor TR10 is connected to the ground.

The feedback circuit 120 is implemented by resistors R11 and R12. The resistor R11 is connected between the output terminal of the high voltage amplifier 101*a* and a positive electrode terminal of an operational amplifier OP1 that constitutes the error amplifier circuit 105. The resistor R12 is connected between an input terminal of the high voltage amplifier 101*a* and the positive electrode terminal of the operational amplifier OP1 that constitutes the error amplifier circuit 105.

The error amplifier circuit 105 is a so-called non-inverting amplifier circuit using the operational amplifier OP1, and is implemented by resistors R13 and R14 and the operational amplifier OP1.

The photo coupler output end 308 of the photo coupler 305 is connected between the gate and the source of the transistor 310. The photo coupler output end 307 of the photo coupler 302 is connected between the gate and the source of the transistor 309.

In the constant current supply unit 312 on the positive electrode side, the gate of the transistor 310 is usually held at a potential obtained by adding a Zener voltage to a potential of the negative power supply line V−. Therefore, the transistor 310 operates such that a constant current flows from the drain toward the source.

In the constant current supply unit 311 on the negative electrode side, the gate of the transistor 309 is usually held at a potential obtained by subtracting the Zener voltage from a potential of the positive power supply line V+. Therefore, the transistor 309 operates such that the constant current flows from the source toward the drain.

The gate of the transistor TR5 is usually held at divided voltage potentials of the resistors R6 and R7, and operates such that the constant current flows through the resistor R5 and the transistors TR5 and TR6 toward a drain side of the transistor 310 in the constant current supply unit 312 on the positive electrode side. Accordingly, the positive-electrode-side level shift circuit 107 outputs a signal level-shifted to a potential obtained by subtracting a voltage drop of the resistor R5 from a potential of the power supply line of the positive electrode voltage VH. When the target voltage setting signal Vin changes, an output signal of the error amplifier circuit 105 changes as a signal obtained by amplifying the target voltage setting signal Vin at a predetermined gain. When the output signal of the error amplifier circuit 105 changes, a gate signal of the transistor TR4 in the positive-electrode-side level shift circuit 107 changes. Then, resistance values of the transistors TR3 and TR4 change, and a ratio of a current that flows to the transistors TR3 and TR4 to a current that flows to the resistor R5 and the transistors TR5 and TR6 changes. Then, an inter-terminal voltage changes due to a voltage drop of the resistor R5. Accordingly, an output signal of the positive-electrode-side level shift circuit 107 changes.

Similarly, the gate of the transistor TR9 is usually held at divided voltage potentials of the resistors R9 and R10, and operates such that the constant current flows from a drain side of the transistor 309 in the constant current supply unit 311 on the negative electrode side to the resistor R8 and the transistors TR9 and TR10. Accordingly, the negative-electrode-side level shift circuit 109 outputs a signal level-shifted from a potential of the power supply line of the negative electrode voltage VL to a potential obtained by adding a voltage drop of the resistor R8. When the target voltage setting signal Vin changes, the output signal of the error amplifier circuit 105 changes as the signal obtained by amplifying the target voltage setting signal Vin at a predetermined gain. When the output signal of the error amplifier circuit 105 changes, a gate signal of the transistor TR8 in the negative-electrode-side level shift circuit 109 changes. Then, resistance values of the transistors TR7 and TR8 change, and a ratio of a current that flows to the transistors TR7 and TR8 to a current that flows to the resistor R8 and the transistors TR9 and TR10 changes. Then, an inter-terminal voltage changes due to the voltage drop of the resistor R8. Accordingly, an output signal of the negative-electrode-side level shift circuit 109 changes.

In response to the change in the target voltage setting signal Vin, a direction of the change in the output signal of the positive-electrode-side level shift circuit 107 and a direction of the change in the output signal of the negative-electrode-side level shift circuit 109 become directions the same as each other. Therefore, the positive-electrode-side output circuit 112 and the negative-electrode-side output circuit 115 perform the push-pull operation.

In the positive-electrode-side current detection circuit 114, a limit value (positive-electrode-side limit value) iL of the current is determined by a way of dividing the current between the resistor 301 and the photo coupler input end 303. In the positive-electrode-side current detection circuit 114, when a current equal to or larger than the limit value iL flows to the resistor 301, the photo coupler input end 303 emits light and operates. Here, when the limit value iL is ilim and a threshold voltage of a photodiode is Vpth, a resistance value of the resistor 301 is theoretically obtained by Vpth/ilim. In the negative-electrode-side gain/offset adjustment circuit 118, when the positive-electrode-side current detection circuit 114 operates, a resistance value of the photo coupler output end 307 decreases. When the resistance value of the photo coupler output end 307 decreases, since the gate-source of the transistor 309 of the constant current supply unit 311 of the negative-electrode-side level shift circuit 109 is clamped, a current supplied to the negative-electrode-side level shift circuit 109 decreases. As a result, the gain of the negative-electrode-side level shift circuit 109 decreases, and the offset amount increases to the negative side.

In the negative-electrode-side current detection circuit 117, a limit value (negative-electrode-side limit value) iL of the current is determined by a way of dividing the current between the resistor 304 and the photo coupler input end 306. In the negative-electrode-side current detection circuit 117, when the current equal to or larger than the limit value iL flows, the photo coupler input end 306 emits light and operates. In the positive-electrode-side gain/offset adjustment circuit 119, when the negative-electrode-side current detection circuit 117 operates, a resistance value of the photo coupler output end 308 decreases. When the resistance value of the photo coupler output end 308 decreases, since the gate-source of the transistor 310 of the constant current supply unit 312 of the positive-electrode-side level shift circuit 107 is clamped, a current supplied to the positive-electrode-side level shift circuit 107 decreases. As a result, the gain of the positive-electrode-side level shift circuit 107 decreases, and the offset amount increases to the positive side.

As described above, according to the mounting example shown in FIG. 3, since the operation of the high voltage amplifier described above is implemented, the through current iW can be reduced to the limit value iM. Further, the linearity near the high-voltage output signal Vout=0 V can be secured, and the crossover distortion can be reduced.

According to the present mounting example, the positive-electrode-side current detection circuit 114 and the negative-electrode-side current detection circuit 117 are electrically insulated from the positive-electrode-side gain/offset adjustment circuit 119 and the negative-electrode-side gain/offset adjustment circuit 118. Therefore, the high voltage of the output stage is not directly applied to the path of the signal input to the gain/offset adjustment circuit, and it is possible to prevent a risk that the high voltage adversely influences the adjustment circuit and an element is damaged due to unforeseen circumstances, and the like.

In the present mounting example, the photo coupler is used for the insulation, but the insulation may be implemented using other methods. For example, a method in which a hall element or the like is used for the current detection circuit, a method in which the output signal of the current detection circuit is transmitted using an insulation transformer, or the like may be adopted.

Embodiment 2

FIG. 4 is a block diagram showing an example of a configuration of a high voltage amplifier according to Embodiment 2. The high voltage amplifier according to the present embodiment is obtained by adding a predetermined function to the high voltage amplifier according to Embodiment 1.

As shown in FIG. 4, a configuration of a high voltage amplifier 102 according to Embodiment 2 is a configuration obtained by adding a signal path 401 from the positive-electrode-side current detection circuit 114 to the positive-electrode-side gain/offset adjustment circuit 119 and a signal path 402 from the negative-electrode-side current detection circuit 117 to the negative-electrode-side gain/offset adjustment circuit 118 to the configuration according to Embodiment 1.

In Embodiment 1, when the positive-electrode-side output circuit current iX that flows through the positive-electrode-side output circuit 112 is increased, the value of the negative-electrode-side level shift signal Sls decreases through the positive-electrode-side current detection circuit 114, the negative-electrode-side gain/offset adjustment circuit 118, and the negative-electrode-side level shift circuit 109. The operation increases an equivalent resistance of the output circuit input transistor 122, and functions to decrease the negative-electrode-side output circuit current iY. In this case, the control of the positive-electrode-side output circuit current iX depends on a value of the high-voltage output signal Vout generated by the output current iZ. Therefore, for example, if the load 124 has a low resistance, the output current iZ continues to increase until the value of the high-voltage output signal Vout is a target value.

Therefore, as shown in FIG. 4, the signal path 401 is added. According to such a configuration, when the positive-electrode-side output circuit current iX equal to or larger than the limit value iL is detected by the positive-electrode-side current detection circuit 114, the positive-electrode-side gain/offset adjustment circuit 119 decreases (changes) a gain of the positive-electrode-side level shift circuit 107, and increases (adjusts) an offset amount to a positive side. Then, an operation is performed such that a value of the positive-electrode-side level shift signal Shs increases, and the positive-electrode-side output circuit current iX does not exceed the limit value iL. That is, even if the output current iZ rapidly increases due to the load 124 being in a short-circuit state, the output current iZ can be limited, and a circuit element can be prevented from being broken or the like due to overcurrent.

On a negative electrode side, the signal path 402 functions similarly to the signal path 401, and achieves similar functions and effects. Therefore, description thereof is omitted here.

<Modification>

The limit value iL for limiting the positive-electrode-side output circuit current iX and the negative-electrode-side output circuit current iY and the limit value iM for limiting the through current iW may be set to different values.

For example, the positive-electrode-side current detection circuit 114 is configured to output a detection signal to the negative-electrode-side gain/offset adjustment circuit 118 when the positive-electrode-side output circuit current iX exceeds a limit value ilimb (limit value B), and output a detection signal to the positive-electrode-side gain/offset adjustment circuit 119 when the positive-electrode-side output circuit current iX exceeds a limit value ilima (limit value A).

The negative-electrode-side current detection circuit 117 is configured to output a detection signal to the negative-electrode-side gain/offset adjustment circuit 118 when the negative-electrode-side output circuit current iY exceeds the limit value ilima, and output a detection signal to the positive-electrode-side gain/offset adjustment circuit 119 when the negative-electrode-side output circuit current iY exceeds the limit value ilimb.

Further, the positive-electrode-side gain/offset adjustment circuit 119 is configured to perform adjustment to increase an offset amount of the positive-electrode-side level shift circuit 107 to a positive side in response to a detection signal from at least one of the positive-electrode-side current detection circuit 114 and the negative-electrode-side current detection circuit 117.

The negative-electrode-side gain/offset adjustment circuit 118 is configured to perform adjustment to increase an offset amount of the negative-electrode-side level shift circuit 109 to a negative side in response to a detection signal from at least one of the positive-electrode-side current detection circuit 114 and the negative-electrode-side current detection circuit 117.

According to such a configuration of Embodiment 2, even if the load 124 has a low resistance or is in a short-circuit state, the output current iZ can be limited, and the circuit element can be prevented from being broken or the like due to the overcurrent.

In Embodiment 2, each current detection circuit is configured to output a signal when a detected current thereof exceeds the limit value, and each gain/offset adjustment circuit is configured to increase offset in response to the signal, but other configurations may be used. For example, each current detection circuit may be configured to output a signal value corresponding to a detected current, and each gain/offset adjustment circuit may be configured to increase an offset amount when a signal value of each current detection circuit exceeds a predetermined threshold. Further, for example, each current detection circuit may be configured to output a signal value corresponding to a detected current, and each gain/offset adjustment circuit may be configured to gradually increase an offset amount as a signal value of each current detection circuit increases. Such configurations can also be applied to the modification according to Embodiment 2.

Embodiment 3

FIG. 5 is a block diagram showing an example of a configuration of a high voltage amplifier according to Embodiment 3. As shown in FIG. 5, in a high voltage amplifier 103 according to Embodiment 3, the positive-electrode-side current detection circuit 114 shown in FIG. 4 is replaced with a current detection circuit 501 (first current detection circuit) and a current detection circuit 502 (second current detection circuit) connected in series, and the negative-electrode-side current detection circuit 117 shown in FIG. 4 is replaced with a current detection circuit 503 (third current detection circuit) and a current detection circuit 504 (fourth current detection circuit) connected in series. Further, the current detection circuit 501 is connected to the positive-electrode-side gain/offset adjustment circuit 119, and the current detection circuit 502 is connected to the negative-electrode-side gain/offset adjustment circuit 118. Further, the current detection circuit 503 is connected to the negative-electrode-side gain/offset adjustment circuit 118, and the current detection circuit 504 is connected to the positive-electrode-side gain/offset adjustment circuit 119.

The positive-electrode-side gain/offset adjustment circuit 119 adjusts an offset amount of the positive-electrode-side level shift circuit 107 based on the first output signal from the current detection circuit 501 and the third output signal from the current detection circuit 503. Further, the negative-electrode-side gain/offset adjustment circuit 118 adjusts an offset amount of the negative-electrode-side level shift circuit 109 based on the second output signal from the current detection circuit 502 and the fourth output signal from the current detection circuit 504.

In the present embodiment, the current detection circuit 501 (first current detection circuit) is designed to output a first detection signal when the detected positive-electrode-side output circuit current iX (first detected current) exceeds a limit value ilimc (first limit value), and the current detection circuit 502 (second current detection circuit) is designed to output a second detection signal when the detected positive-electrode-side output circuit current iX (second detected current) exceeds a limit value ilimd (second limit value). Further, the current detection circuit 503 (third current detection circuit) is designed to output a third detection signal when the detected negative-electrode-side output circuit current iY (third detected current) exceeds a limit value ilime (third limit value), and the current detection circuit 504 (fourth current detection circuit) is designed to output a fourth detection signal when the detected negative-electrode-side output circuit current iY (fourth detected current) exceeds a limit value ilimf (fourth limit value). As described above, on each of the positive electrode side and the negative electrode side, the current detection circuit that transmits a signal to the positive-electrode-side gain/offset adjustment circuit 119 and the current detection circuit that transmits a signal to the negative-electrode-side gain/offset adjustment circuit 118 may be separately disposed.

As another embodiment, the following embodiment can also be considered. The current detection circuit 501 is designed to output a first detected current signal representing the detected positive-electrode-side output circuit current iX, and the current detection circuit 502 is designed to output a second detected current signal representing the detected positive-electrode-side output circuit current iX. Further, the current detection circuit 503 is designed to output a third detected current signal representing the detected negative-electrode-side output circuit current iY, and the current detection circuit 504 is designed to output a fourth detected current signal representing the detected negative-electrode-side output circuit current iY.

The positive-electrode-side gain/offset adjustment circuit 119 adjusts an offset amount of the positive-electrode-side level shift circuit 107 based on magnitudes of values of the first detected current signal from the current detection circuit 501 and the third detected current signal from the current detection circuit 503. Further, the negative-electrode-side gain/offset adjustment circuit 118 adjusts an offset amount of the negative-electrode-side level shift circuit 109 based on magnitudes of values of the second detected current signal from the current detection circuit 502 and the fourth detected current signal from the current detection circuit 504.

For example, the positive-electrode-side gain/offset adjustment circuit 119 increases the offset amount of the positive-electrode-side level shift circuit 107 to a positive side as the first detected current signal and the third detected current signal increase. Further, the negative-electrode-side gain/offset adjustment circuit 118 increases the offset amount of the negative-electrode-side level shift circuit 109 to a negative side as the second detected current signal and the fourth detected current signal increase.

For example, the positive-electrode-side gain/offset adjustment circuit 119 increases the offset amount of the positive-electrode-side level shift circuit 107 to the positive side when a value of the first detected current signal exceeds a predetermined threshold, or when a value of the third detected current signal exceeds a predetermined threshold. Further, the negative-electrode-side gain/offset adjustment circuit 118 increases the offset amount of the negative-electrode-side level shift circuit 109 to the negative side when a value of the second detected current signal exceeds a predetermined threshold, or when a value of the fourth detected current signal exceeds a predetermined threshold.

According to such a configuration of Embodiment 3, the limit value of the current that is a threshold of a condition under which the current detection signal is output can be independently set for each current detection circuit, and a degree of freedom of design can be increased.

Various embodiments of the invention have been described above, but the invention is not limited to the embodiments described above, and includes various modifications. Further, the embodiments described above have been described in detail to describe the invention in an easy-to-understand manner, and the invention is not necessarily limited to including all the described configurations. Further, a part of a configuration according to a certain embodiment can be replaced with a configuration according to another embodiment, and a configuration according to another embodiment can be added to a configuration according to a certain embodiment. All of these belong to the scope of the invention. Further, numerical values, names, or the like included in text and figures are merely examples, and effects of the invention will not be impaired even if different numerical values or names are used.

For example, the MOSFET is used for the output circuit in the embodiments described above, but other elements such as a bipolar transistor or a vacuum tube may be used.

It is possible to add, delete, or replace a part of a configuration of each embodiment with another configuration. Further, a part or all of each configuration, a function, a circuit, or the like described above may be implemented by designing with, for example, an integrated circuit or a programmable semiconductor chip.

REFERENCE SIGNS LIST

101: high voltage amplifier
105: error amplifier circuit
107: positive-electrode-side level shift circuit
109: negative-electrode-side level shift circuit
118: negative-electrode-side gain/offset adjustment circuit
119: positive-electrode-side gain/offset adjustment circuit
111: high-voltage output circuit
112: positive-electrode-side output circuit
114: positive-electrode-side current detection circuit
115: negative-electrode-side output circuit
117: negative-electrode-side current detection circuit
120: feedback circuit
127, 128, 131, 132: voltage dividing resistor
Vin: target voltage setting signal
Vout: high-voltage output signal
iW: through current
iX: positive-electrode-side output circuit current
iY: negative-electrode-side output circuit current
iZ: output current

The invention claimed is:

1. A high voltage amplifier comprising:

an input circuit configured to amplify an input signal;

a positive-electrode-side level shift circuit configured to shift an input amplified signal from the input circuit to a positive side;

a negative-electrode-side level shift circuit configured to shift the input amplified signal to a negative side;

a high-voltage output circuit including a positive-electrode-side output circuit configured to amplify a positive-electrode-side level shift signal from the positive-electrode-side level shift circuit and a negative-electrode-side output circuit configured to amplify a negative-electrode-side level shift signal from the negative-electrode-side level shift circuit; and a feedback circuit configured to feed back a high-voltage output signal from the high-voltage output circuit to the input signal, wherein the high voltage amplifier comprises a positive-electrode-side current detection circuit configured to detect a current that flows to the positive-electrode-side output circuit, a negative-electrode-side current detection circuit configured to detect a current that flows to the negative-electrode-side output circuit, a positive-electrode-side offset adjustment circuit configured to perform adjustment to increase an offset amount of the positive-electrode-side level shift circuit to a positive side when a negative-electrode-side detected current of the negative-electrode-side current detection circuit increases, and a negative-electrode-side offset adjustment circuit configured to perform adjustment to increase an offset amount of the negative-electrode-side level shift circuit to a negative side when a positive-electrode-side detected current of the positive-electrode-side current detection circuit increases, an output terminal to which a load is connected is provided between the positive-electrode-side output circuit and the negative-electrode-side output circuit, the positive-electrode-side current detection circuit is disposed upstream or downstream of the positive-electrode-side output circuit, the negative-electrode-side current detection circuit is disposed upstream or downstream of the negative-electrode-side output circuit, and the positive-electrode-side current detection circuit and the negative-electrode-side current detection circuit are electrically insulated from the positive-electrode-side offset adjustment circuit and the negative-electrode-side offset adjustment circuit.

2. The high voltage amplifier according to claim 1, wherein the positive-electrode-side current detection circuit outputs a positive-electrode-side current detection signal when the positive-electrode-side detected current exceeds a positive-electrode-side limit value, the negative-electrode-side current detection circuit outputs a negative-electrode-side current detection signal when the negative-electrode-side detected current exceeds a negative-electrode-side limit value, the positive-electrode-side offset adjustment circuit performs adjustment to increase the offset amount of the positive-electrode-side level shift circuit to a positive side in response to the negative-electrode-side current detection signal, and the negative-electrode-side offset adjustment circuit performs adjustment to increase the offset amount of the negative-electrode-side level shift circuit to a negative side in response to the positive-electrode-side current detection signal.

3. The high voltage amplifier according to claim 1, wherein the positive-electrode-side offset adjustment circuit performs adjustment to increase the offset amount of the positive-electrode-side level shift circuit to a positive side when at least one of the positive-electrode-side detected current and the negative-electrode-side detected current increases, and the negative-electrode-side offset adjustment circuit performs adjustment to increase the offset amount of the negative-electrode-side level shift circuit to a negative side when at least one of the positive-electrode-side detected current and the negative-electrode-side detected current increases.

4. The high voltage amplifier according to claim 3, wherein the positive-electrode-side current detection circuit outputs a positive-electrode-side current detection signal when the positive-electrode-side detected current exceeds a positive-electrode-side limit value, the negative-electrode-side current detection circuit outputs a negative-electrode-side current detection signal when the negative-electrode-side detected current exceeds a negative-electrode-side limit value, the positive-electrode-side offset adjustment circuit performs adjustment to increase the offset amount of the positive-electrode-side level shift circuit to a positive side in response to at least one of the positive-electrode-side current detection signal and the negative-electrode-side current detection signal, and the negative-electrode-side offset adjustment circuit performs adjustment to increase the offset amount of the negative-electrode-side level shift circuit to a negative side in response to at least one of the positive-electrode-side current detection signal and the negative-electrode-side current detection signal.

5. The high voltage amplifier according to claim 3, wherein the positive-electrode-side current detection circuit outputs a positive-electrode-side current detection signal to the negative-electrode-side offset adjustment circuit when the positive-electrode-side detected current exceeds a first limit value, and outputs the positive-electrode-side current detection signal to the positive-electrode-side offset adjustment circuit when the positive-electrode-side detected current exceeds a second limit value, the negative-electrode-side current detection circuit outputs a negative-electrode-side current detection signal to the positive-electrode-side offset adjustment circuit when the negative-electrode-side detected current exceeds the first limit value, and outputs the negative-electrode-side current detection signal to the negative-electrode-side offset adjustment circuit when the negative-electrode-side detected current exceeds the second limit value, the positive-electrode-side offset adjustment circuit performs adjustment to increase the offset amount of the positive-electrode-side level shift circuit to a positive side in response to at least one of the positive-electrode-side current detection signal and the negative-electrode-side current detection signal, and the negative-electrode-side offset adjustment circuit performs adjustment to increase the offset amount of the negative-electrode-side level shift circuit to a negative side in response to at least one of the positive-electrode-side current detection signal and the negative-electrode-side current detection signal.

6. The high voltage amplifier according to claim 1, wherein the positive-electrode-side current detection circuit includes a first current detection circuit and a second current detection circuit connected in series, the negative-electrode-side current detection circuit includes a third current detection circuit and a fourth current detection circuit connected in series, the positive-electrode-side offset adjustment circuit adjusts the offset amount of the positive-electrode-side level shift circuit based on a first output signal from the first current detection circuit and a third output signal from the third current detection circuit, and the negative-electrode-side offset adjustment circuit adjusts the offset amount of the negative-electrode-side level shift circuit based on a second output signal from the second current detection circuit and a fourth output signal from the fourth current detection circuit.

7. The high voltage amplifier according to claim 6, wherein the first current detection circuit outputs a first detection signal when a first detected current detected by the first current detection circuit exceeds a first limit value, the second current detection circuit outputs a second detection signal when a second detected current detected by the second current detection circuit exceeds a second limit value, the third current detection circuit outputs a third detection signal when a third detected current detected by the third current detection circuit exceeds a third limit value, the fourth current detection circuit outputs a fourth detection signal when a third detected current detected by the fourth current detection circuit exceeds a fourth limit value, the positive-electrode-side offset adjustment circuit increases the offset amount of the positive-electrode-side level shift circuit to a positive side in response to the first detection signal or the third detection signal, and the negative-electrode-side offset adjustment circuit increases the offset amount of the negative-electrode-side level shift circuit to a negative side in response to the second detection signal or the fourth detection signal.

8. The high voltage amplifier according to claim 1, wherein the positive-electrode-side offset adjustment circuit adjusts the offset amount of the positive-electrode-side level shift circuit by changing a gain of the positive-electrode-side level shift circuit, and the negative-electrode-side offset adjustment circuit adjusts the offset amount of the negative-electrode-side level shift circuit by changing a gain of the negative-electrode-side level shift circuit.

9. The high voltage amplifier according to claim 1, wherein a maximum output voltage from the output terminal is equal to or higher than 200 V and lower than 1000 V.

* * * * *